(12) United States Patent
Vasquez et al.

(10) Patent No.: US 10,879,457 B2
(45) Date of Patent: *Dec. 29, 2020

(54) MAGNETIC TUNNEL JUNCTION WAFER ADAPTOR USED IN MAGNETIC ANNEALING FURNACE AND METHOD OF USING THE SAME

(71) Applicant: Spin Memory, Inc., Fremont, CA (US)

(72) Inventors: Jorge Vasquez, Fremont, CA (US); Danny Yam, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/584,731

(22) Filed: Sep. 26, 2019

(65) Prior Publication Data

US 2020/0020853 A1 Jan. 16, 2020

Related U.S. Application Data

(63) Continuation of application No. 15/916,078, filed on Mar. 8, 2018, now Pat. No. 10,446,744.

(51) Int. Cl.
*H01L 43/12* (2006.01)
*H01L 43/08* (2006.01)

(52) U.S. Cl.
CPC .............. *H01L 43/12* (2013.01); *H01L 43/08* (2013.01)

(58) Field of Classification Search
CPC .............................. H01L 43/12; H01L 43/08
See application file for complete search history.

Primary Examiner — Karen Kusumakar

(57) ABSTRACT

Semiconductor substrate adaptor configured to adapt a substrate of a first dimension to a second dimension, such that the substrate can be properly supported by a supporting mechanism (e.g., a wafer cassette) customized for substrates of the second dimension. The substrate adaptor may be made of quartz. The combination of the substrate adaptor and a substrate fitting therein causes no perturbation in various aspects of a semiconductor process. Therefore, the substrate adaptor conveniently enables a substrate of the first dimension to be processed in the same processing equipment and conditions as a substrate of the second dimension. A vertical substrate adaptor may have a semicircular body with a semicircular cutout for accommodating a wafer and can support a wafer vertically. A horizontal substrate adaptor may have a circular body with a circular cutout for accommodating an entire wafer and supporting the wafer horizontally.

20 Claims, 7 Drawing Sheets

MAGNETIC TUNNEL JUNCTION WAFER ADAPTOR USED IN MAGNETIC ANNEALING FURNACE AND METHOD OF USING THE SAME

The present patent application is a continuation of, and claims benefit to, co-pending patent application Ser. No. 15/916,078, filed on Mar. 8, 2018 and entitled "Magnetic Tunnel Junction Wafer Adaptor Used in Magnetic Annealing Furnace and Method of Same,", with inventors Jorge Vasquez and Danny Yam, which application is hereby incorporated by reference herein.

BACKGROUND OF THE INVENTION

Field of the Invention

Magnetoresistive random-access memory (MRAM) is a non-volatile random-access memory technology that has been recognized to potentially meet the demands for continued increases in density of existing memory technologies, notably flash RAM and DRAM. A Magnetic Tunnel Junction (MTJ)-based MRAM device includes arrays of MTJ-based memory cells which can store data in the magnetization orientation between ferromagnetic layers of the MTJ in each cell.

More specifically, an MTJ includes three essential layers: a free layer, a tunneling barrier layer, and a pinned layer. The free layer and the pinned layer are ferromagnetic layers, the tunneling barrier layer is a thin insulator layer located in-between. In the free layer, the magnetization direction is free to rotate; whereas, the magnetization of the pinned layer is fixed and therefore this layer is also referred as the "fixed layer." An anti-ferromagnetic layer may be used to fix, or pin, the magnetization of the pinned layer in a particular direction. A data bit is written to the MTJ by changing the magnetization direction of one of the ferromagnetic plates of the magnetic element. The orientations of the magnetic moments of the free layer and the pinned layer determine the resistance of the MTJ which dictates the bit value of the memory cell, "0" or "1."

Spin torque transfer (STT) is a technique for writing to MTJ-based memory cells. When a spin-polarized current (most of the electrons of the current have spins aligned in the same direction) is applied to a free ferromagnetic layer, the electrons may get repolarized on account of the orientation of the magnetic moments of the free layer. The free layer experiences a torque associated with the change in the angular momentum of the electrons as they are repolarized. If the current density is high enough, this torque has enough energy to switch the magnetization direction of the free layer. As a result, the bit data represented by the memory cell can switch between "1" and "0." The advantages of using STT for writing to magnetic elements have been well established, including smaller bit size, fewer process steps, better scalability for large arrays, and lower writing current requirements, as compared with other writing techniques.

Depending on the orientation of the magnetic anisotropy of the fixed layers, there are two main types of MTJs used in MRAM, perpendicular MTJs and in-plane MTJs. In a perpendicular MTJ, the magnetic anisotropy of the fixed layer is generally perpendicular to the planes of fixed layer and the substrate surface; whereas in an in-plane MTJ, the magnetic anisotropy of the fixed layer is generally parallel to the planes of fixed layer and the substrate surface.

Fabrication of MTJ-based memory cells involves complex processing procedures, including formation of a stack of multiple layers of various films and several annealing steps. Particularly, after a fixed layer is deposited on a Silicon substrate and etched into pillars for individual MTJ cells, the substrate undergoes a magnetic annealing process to magnetize the fixed layer pillars. For example, the magnetic annealing process is executed in a furnace (or an annealing chamber) under vacuum at an elevated temperature by using a predetermined external magnetic field.

During such a magnetic annealing process, it is critical that the features on the substrate are uniformly and consistently subject to the temperature and magnetic field as defined in a processing recipe. Practically, limited by the overall size of the annealing equipment, the magnetic field and the temperature distribution in the annealing chamber can only be optimized for a relatively small center region yet sufficient to encompass the processing zone. A cassette holding the substrates has to be placed precisely within the small region to ensure processing uniformity and repeatability. Moreover, to maintain the steady-state temperature precisely at the intended level and ensure the temperature ramping profiles to be consistent in each magnetic annealing process, a proportional-integral-derivative (PID) controller of the heating system is calibrated based on the thermal load of a particular size of substrates, e.g., 300 mm Si wafers. If any deviation from the anticipated thermal load is sensed in the annealing chamber, the PID controller tends to cause temperature instability which could lead to manufacturing failure. Thus, conventionally, unless the PID controller is recalibrated, the annealing equipment is restricted to processing a particular pre-calibrated size of substrates because loading a different size of substrates and a matching cassette would introduce a substantial thermal load change for which the heater is not calibrated to process. Unfortunately, a recalibration procedure of a PID controller is usually time-consuming, error-prone and can contribute to significant production cost.

SUMMARY OF THE INVENTION

Disclosed herein are mechanisms that provide a substrate adaptor for adapting a substrate of a first dimension to a second dimension so that the substrate can be loaded and processed in a processing chamber that has been configured and optimized for processing substrates of the second or a different dimension.

Embodiments of the present disclosure provide a substrate adaptor having a planar body that substantially mimics a 300 mm wafer and a cutout that can accommodate a wafer of a smaller size, for example 50 mm, 100 mm, 150 mm or 200 mm. The substrate adaptor is made of a material that has the same thermal mass as Si wafers and can fit in a cassette or another substrate supporting mechanism designed for 300 mm wafers. For example, when used in a magnetic annealing chamber that has been optimized for 300 mm wafers, the substrate adaptor with a smaller wafer fitting in the cutout advantageously causes no perturbation to the magnetic field and the temperature distribution or ramping profile in the chamber when processing a smaller wafer. In compliance with the semiconductor wafer standards, the substrate holder may have an alignment notch and the cutout may have one or more alignment flats. In one preferred embodiment, the substrate adaptor is made of quartz which is typically non-reactive and is also the same material as a cassette typically used in an annealing chamber.

In the following discussion, 300 mm wafers are discussed as the control wafer size for the calibration of the thermal heater system. However, this convention is merely exemplary and any control wafer diameter can be used equally well with the embodiments of the present disclosure. The adaptor, either vertical or horizontal, can be used with any sized control wafer diameter.

In one embodiment, the substrate adaptor is configured to support a smaller-than-300 mm wafer in a vertical position for processing, herein also referred as "vertical substrate adaptor." In one exemplary application, in-plane MTJ devices are fabricated on the wafer and the adaptor is used in a magnetic annealing process to magnetize the fixed layer pillars on the wafer with the wafer oriented in parallel with an external magnetic field. The vertical substrate adaptor is semicircular with a diameter of 300 mm, and one or more semicircular cutouts are formed on the diameter edge side. Each cutout has substantially the same dimension as the smaller-than-300 mm wafer and has a slot running through the semicircle perimeter. For instance, the slot on the cutout is approximately 3 mm in depth. With this configuration, the edge of half of the wafer can be inserted into the slot and thereby supported and oriented vertically in the same plane as the substrate adaptor, e.g., while the substrate adaptor is positioned vertically in a cassette designed for 300 mm wafers.

In another embodiment, the substrate adaptor is configured to support a smaller-than-300 mm wafer in a horizontal position for processing, herein also referred as a horizontal substrate adaptor. In one exemplary application, perpendicular MTJ devices are fabricated on the wafer and the vertical substrate adaptor is used in a magnetic annealing to magnetize the fixed layer pillars on the wafer with the wafer oriented perpendicular to an external magnetic field. The substrate adaptor has a 300 mm planar body that is substantially circular and has the substantially same perimeter contour as a 300 mm wafer. Thus, the substrate adaptor can fit in a cassette designed for 300 mm wafers. One or more circular cutouts are formed on the circular body, and each cutout has a step running through the entire perimeter. The step has a width of about 3 mm for instance. With this configuration, the smaller wafer can entirely fit in the cutout and supported by the step, e.g., while the substrate adaptor is positioned horizontally in a 300 mm wafer cassette. When the wafer is coupled to the substrate adaptor, their upper surfaces are approximately in the same plane.

According to embodiments of the present disclosure, a substrate holder can be used to adapt a wafer of one size to fit in a cassette designed for wafers of a different size. The combination of the substrate holder with the smaller wafer mimics the size and density of the larger wafer. Thus, processing equipment optimized for a particular size of wafers (e.g., 300 mm wafers) can flexibly process a smaller size of wafers (e.g., 50 mm or 150 mm) without requiring hardware reconfigurations or processing recipe modifications, advantageously eliminating the time and expense associated with making such changes.

BRIEF DESCRIPTION OF THE DRAWINGS

Embodiments of the present invention will be better understood from a reading of the following detailed description, taken in conjunction with the accompanying figures, in which like reference characters designate like elements.

DETAILED DESCRIPTION

Figure 1:
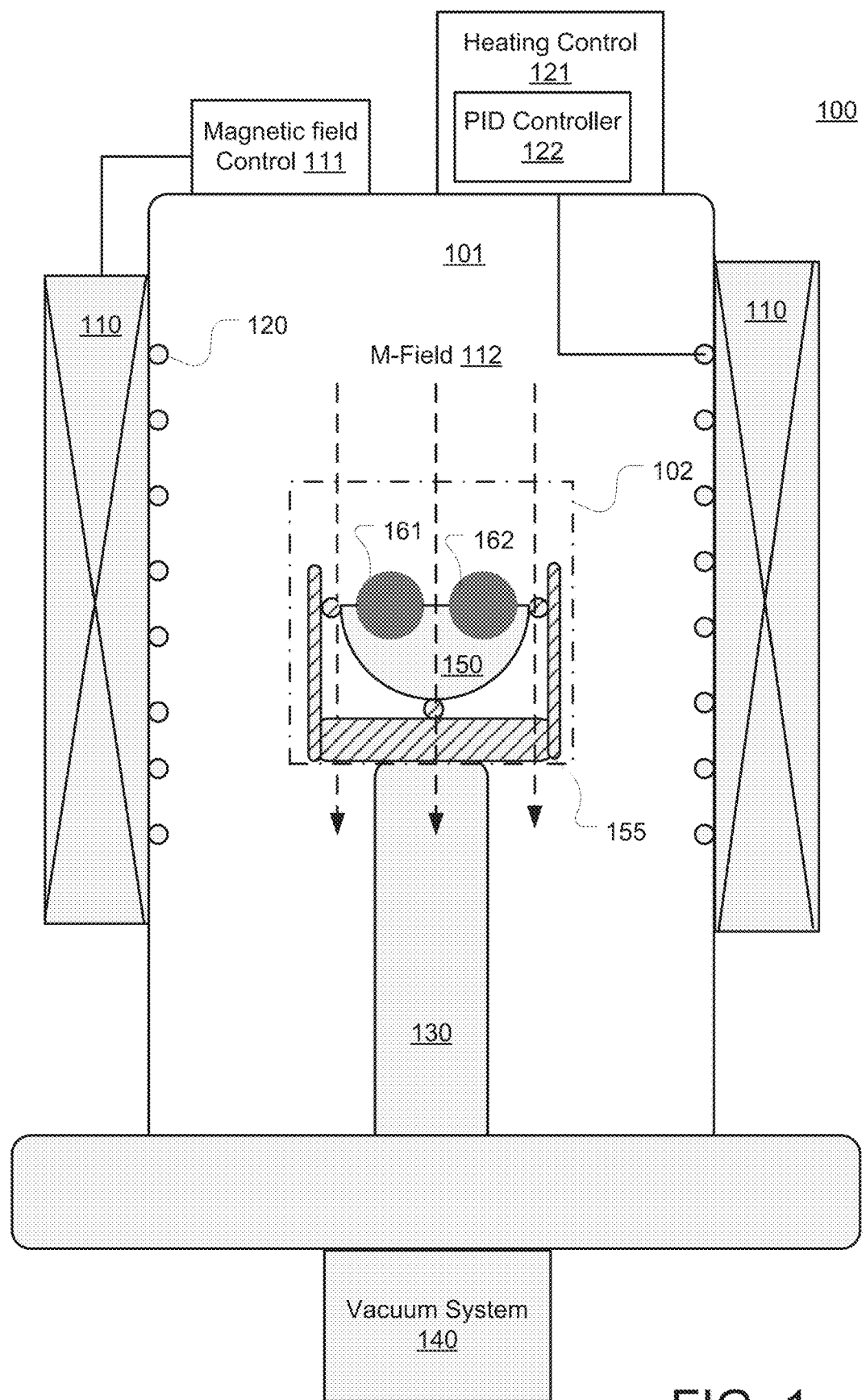
FIG. 1 illustrates the configuration of a magnetic anneal furnace that can process 100 mm wafers as well as 300 mm wafers in a vertical orientation for in-plane magnetization by using an exemplary substrate adaptor in accordance with an embodiment of the present disclosure.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Magnetic Tunnel Junction Wafer Adaptor Used in Magnetic Annealing Furnace and Method of Using the Same Overall, embodiments of the present disclosure provide a semiconductor substrate adaptor configured to adapt a substrate of a first dimension to a second dimension, such that the substrate can be properly supported by a supporting mechanism that is customized for substrates of the second dimension. The substrate adaptor is made of a material that has similar thermal, electrical and magnetic properties with the substrate material. Thus, the combination of the substrate adaptor and a substrate accommodated therein mimics the size and density of a wafer of the second dimension and therefore would cause no remarkable perturbation to various aspects of a semiconductor process, such as chemistry, electrical field distribution, temperature distribution and ramping profiles, magnetic field distribution in the processing zone that has been calibrated for second dimension wafers. Therefore, the substrate adaptor conveniently enables a substrate of the first dimension to be processed in the same processing equipment and conditions as a substrate of the second dimension.

Although embodiments herein are described in detail with reference to substrates and equipment used for Magnetic Tunnel Junction (MTJ)-based memory fabrication, the present disclosure is not limited to such application. A substrate holder in accordance with an embodiment of the present disclosure can be used to adapt and support a wafer in any suitable processing chamber and for any suitable fabrication process, such as etching, deposition, annealing, lithography, implantation and etc.

Herein, embodiments of the present disclosure are described in detail by using Si wafers compliant with semiconductor standards as substrates. However, it will be appreciated that a substrate adaptor according to embodiments of the disclosure can be made for any other suitable type of substrate for semiconductor fabrication. Further, the present disclosure is not limited to any specific dimension of a substrate holder, or the dimension of a wafer that can fit in the substrate holder and is not limited to any control wafer size, e.g., 300 mm.

FIG. 1 illustrates the configuration of a magnetic annealing furnace 100 that can process 100 mm wafers 161 and 162 as well as 300 mm wafers aligned in a vertical orientation for in-plane magnetization by using an exemplary substrate adaptor 150 in accordance with an embodiment of the present disclosure. For example, the wafers 161 and 162 are fabricated for producing MTJ-based MRAM cells. Before loading to the magnetic annealing furnace 100, the wafers 161 and 162 has been processed and deposited with a fixed magnetization layer which has been etched into pillars.

During the magnetic annealing process, the annealing chamber 101 is maintained under vacuum and heated to a preset temperature, and an external magnetic field 112 in the axial direction of the chamber 101 is applied to the wafers. The furnace 100 includes electromagnetic coils 110 and a control module 111 for controlling the generation of the magnetic field 112. Heating elements 120 are disposed inside or around the annealing chamber 101 and coupled to thermocouples (not shown) and a heating control module 121. A vacuum system 140 operates to achieve a vacuum in the chamber 101. The heating control module 121 uses a proportional-integral-derivative (PID) controller 122 to maintain the chamber temperature at a preset level and control the temperature ramping profiles.

The annealing chamber 101 and various components therein may have been configured and optimized for in-plane magnetization of 300 mm wafers. As noted above, due to spatial non-uniformity of the magnetic field and temperature distribution across the processing chamber, it is only practical to achieve a uniform magnetic field and a uniform temperature in a relatively small processing zone (shown by the box 102) where the wafer cassette is positioned for processing as shown. The substrate pedestal 130 has a coupling mechanism configured to load and support a 300 mm wafer cassette to the optimized processing zone 102. The PID controller 122 has been calibrated based on a thermal load of a cassette of 300 mm wafers. If any deviation from this anticipated thermal load is sensed in the annealing chamber 101, the PID controller 122 tends to cause undesirable temperature instability. It will be appreciated that a same number of wafers of a different size, e.g., 50 or 200 mm, constitutes a substantially different thermal load than a cassette of 300 mm wafers.

According to an embodiment of the present disclosure, wafers smaller than 300 mm are coupled to a vertical substrate adaptor 150 that mimics a portion of a 300 mm wafer. The substrate adaptor 150 has two semicircular cutouts configured to accommodate two 100 mm wafers 161 and 162. The configuration of the vertical substrate adaptor is described in greater detail below with reference to FIGS. 3, 4A and 4B. As illustrated, two 100 mm wafers 161 and 162 are supported vertically by the substrate adaptor 150 in a 300 mm wafer cassette 155 and positioned in the same plane as the substrate adaptor 150. Because the smaller wafers 161 and 162 can still be properly contained a 300 mm cassette, they can be placed in the optimized processing zone 102 when the pedestal 130 is elevated to the same height as defined for processing 300 mm wafers.

Further, because the vertical substrate adaptor 150 is made of a material that has a similar thermal mass with the substrate material, the thermal load difference between a 300 mm wafer and the smaller wafers 161 and 162 combined the substrate holder is insignificant from the perspective of the PID controller 122. This advantageously eliminates the need for recalibrating the PID controller 122 when switching from processing 300 mm wafers to processing 100 mm wafers thereby advantageously saving calibration time and expense. A substrate adaptor can be made of any suitable material or composition of materials without departing from the scope of the present disclosure. Preferably, the substrate holder 150 is made of material that is chemically inert, electrically insulating, and non-magnetic. In some embodiments, the substrate adaptor 150 is made of quartz. Such a substrate adaptor advantageously does not interfere with any processing conditions as it does not alter the electrical field, magnetic field or chemistry environment (if any) in processing equipment.

Figure 2:
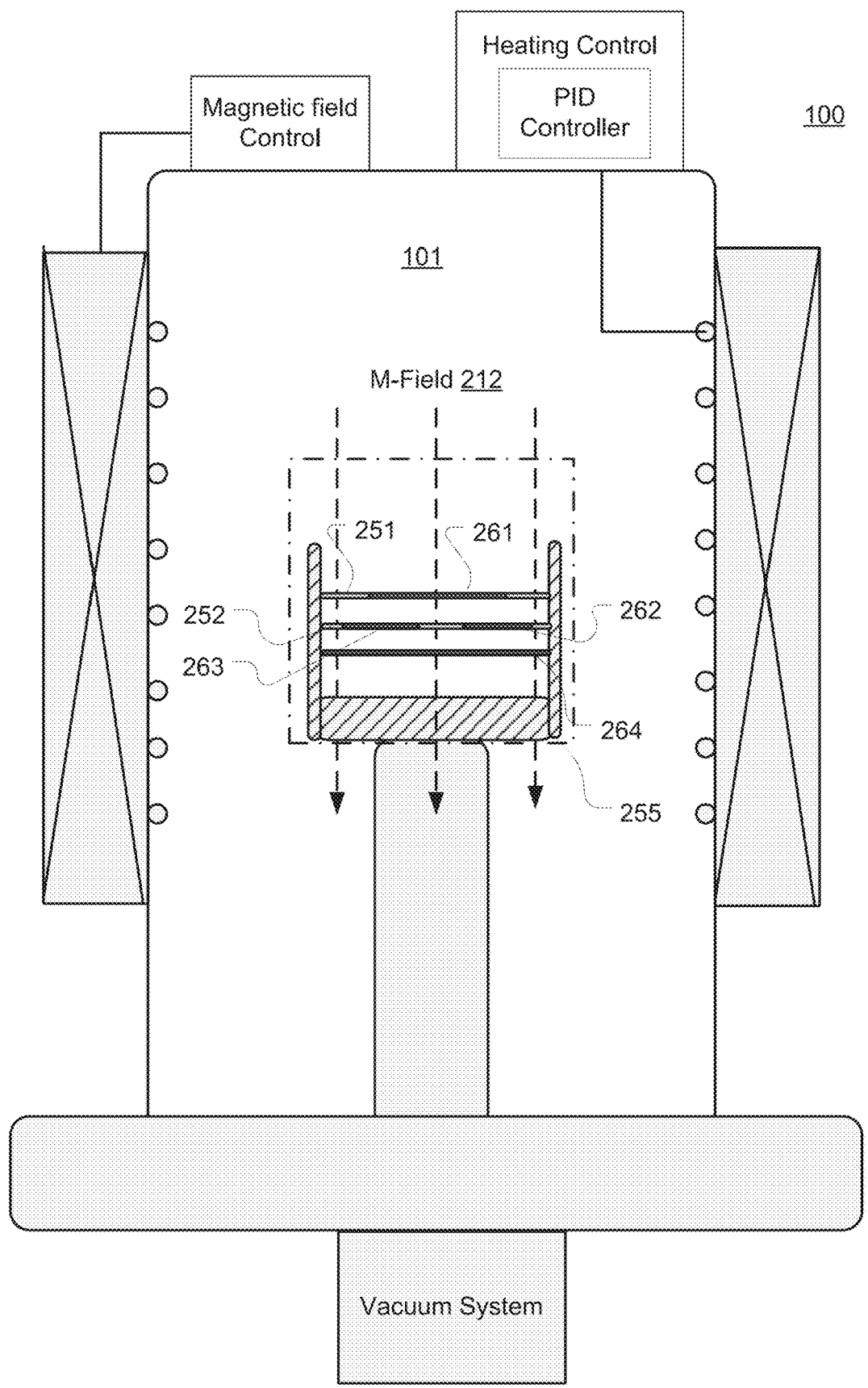
FIG. 2 illustrates the configuration of the magnetic annealing furnace that can process wafers smaller than 300 mm as well as 300 mm wafers in a horizontal orientation for perpendicular magnetization by using exemplary substrate adaptors in accordance with embodiments of the present disclosure.

The same magnetic annealing furnace 100 can also be used to process wafers in a horizontal orientation for perpendicular magnetization, where the wafers are positioned horizontally and perpendicular to the axial magnetic field. FIG. 2 illustrates the configuration of the magnetic annealing furnace 100 that can process wafers smaller than 300 mm as well as 300 mm wafers in a horizontal orientation for perpendicular magnetization by using exemplary substrate adaptors 251 and 252 in accordance with embodiments of the present disclosure. The cassette 255 is customized for supporting 300 mm wafers horizontally, e.g., the 300 mm wafer 264. Besides, the cassette can also support wafers smaller 300 mm 261, 262 and 263 by using horizontal substrate adaptors 251 and 252.

Similar with the example shown in FIG. 1, before loading into the annealing equipment 100, the wafers 261, 262, 263 and 264 have been deposited with a fixed magnetization layer which has been etched into pillars. During the magnetic annealing process, the annealing chamber 101 is maintained under vacuum and heated to a preset temperature, an external magnetic field 212 in the axial direction of the processing chamber is applied to the wafers. The annealing chamber 101 and various components therein may have been configured and optimized for perpendicular magnetization of 300 mm wafers.

According to an embodiment of the present disclosure, a wafer smaller than 300 mm can be coupled to a horizontal substrate adaptor which has a perimeter that mimics the perimeter of a 300 mm wafer and therefore can be loaded in the 300 mm cassette for processing in a horizontal orientation. More specifically, the horizontal substrate adaptor 251 has a single circular cutout (with supporting lip) configured to accommodate the entire 200 mm wafer 261 horizontally. The horizontal substrate adaptor 252 has two circular cutout configured to entirely accommodate the 100 mm wafers 262 and 263. The configurations of the horizontal substrate adaptors are described in greater detail below with reference to FIGS. 5, 6A and 6B.

Figure 3:
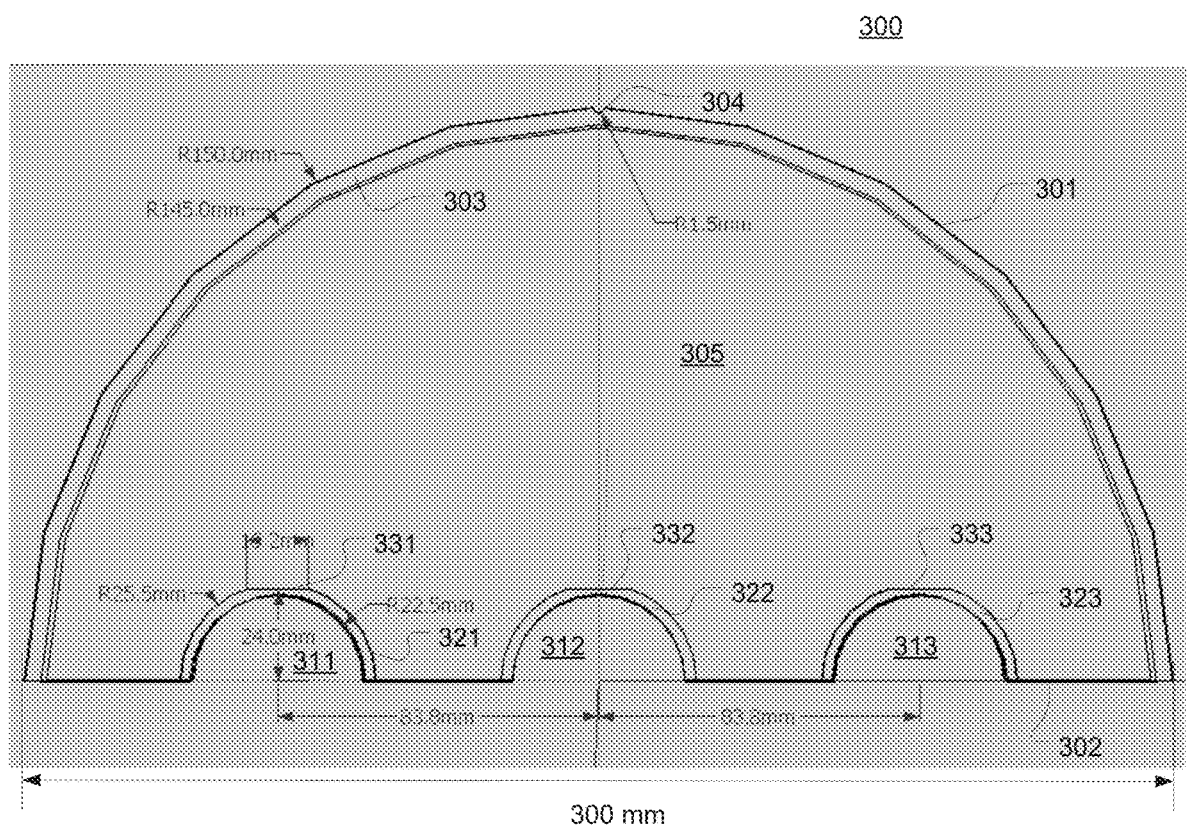
FIG. 3 illustrates the configuration of an exemplary vertical substrate adaptor that can support three 50 mm wafers vertically in accordance with an embodiment of the present disclosure.

FIG. 3 illustrates the configuration of an exemplary vertical substrate adaptor 300 in more detail that can support three 50 mm wafers vertically in accordance with an embodiment of the present disclosure. The substrate adaptor 300 is based on a planar body 305 that is substantially semicircular with a 300 mm diameter. The semicircular body is defined by the curved edge 301 and the diameter edge 302 which is incomplete due to cutouts. Three 50 mm substantially semicircle cutouts 311, 312 and 313 are formed on the diameter edge side of the semicircle body and configured to accommodate 50 mm wafers. In this example, the cutouts 311-313 are coaxial with semicircle body 305. The centers of two adjacent cutouts are spaced apart by 83.8 mm for instance.

A trench or slot 322, 323 or 324 is formed around the semicircle perimeter of each cutout so that a wafer can be inserted therein. In this configuration, as the vertical substrate adaptor 300 is placed vertically with the cutouts on the top and the trenches open to the top (e.g., as sitting in a slot of a 300 mm wafer cassette), the edge the half of a 50 mm wafer is inserted into the trench and thus the wafer can be held in a vertical orientation as well (e.g., see the wafers fitting in the vertical substrate adaptor 150 in FIG. 1). In the illustrated example, the trench is about 3 mm deep. The middle portion of the semicircle body (e.g., up to radius=145 mm) may be thicker than a 50 mm wafer. However, a 5 mm band 303 around the curved edge 301 is made to have substantially the same thickness as the edge of a 300 mm wafer so that the curved edge 301 can fit in a slot of a standard 300 mm wafer cassette. Further, the vertical substrate holder 300 has an alignment notch 304 with radius of 1.5 mm, similar with a standard 300 mm wafer. By the same token, the cutouts 311-313 have alignment flats 331-333 for standard 50 mm wafers to fit in.

The weight of the substrate adaptor 300 is selected such that it, in combination with three smaller wafers inserted into slots 311-313 will mimic the weight of a single wafer with a 300 mm diameter. This weight of the substrate adaptor 300 can be realized by adjusting the thickness of the wafer.

In some other embodiments, rather than based on a semicircular body as shown in FIG. 3, a vertical substrate adaptor can be based on a less-than-semicircle or a minor segment of a circle. In still some other embodiments, a vertical substrate adaptor can be based on a more-than-semicircle or a major segment of a circle. A cutout in a vertical substrate adaptor may also be a minor segment of a circle rather than a semicircle.

Figure 4A:
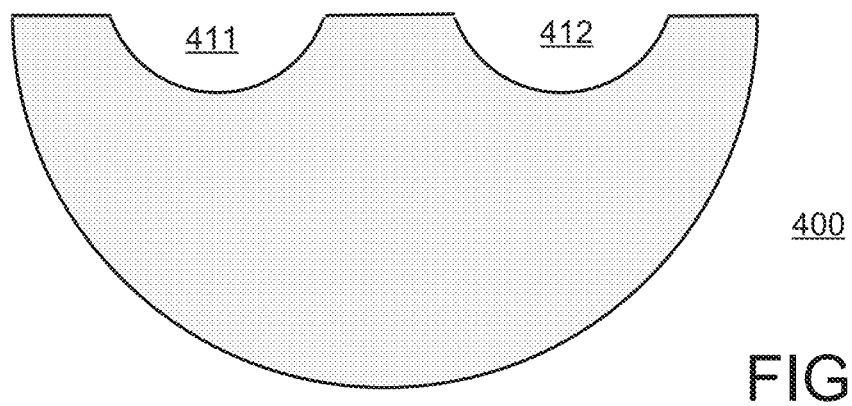
FIGS. 4A-4B illustrate exemplary cutout layouts in vertical substrate adaptors in accordance with embodiments of the present disclosure.
Figure 4B:
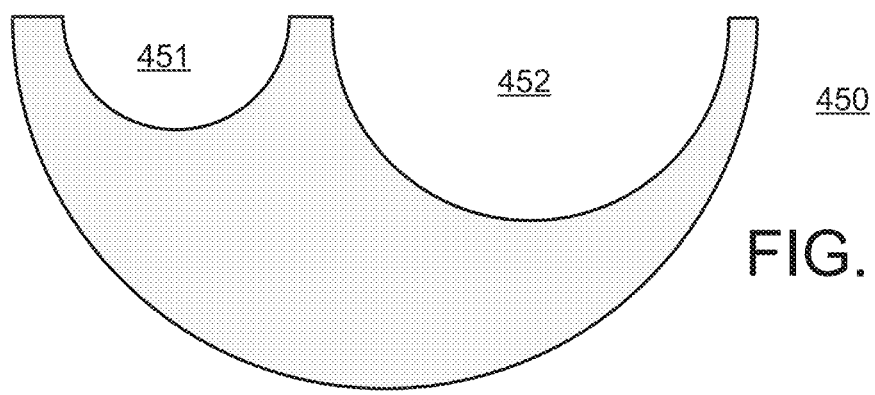

The present disclosure is not limited to any specific layout, position or geometry of a cutout for accommodating a wafer in a substrate adaptor, nor limited to any specific number of cutouts in a substrate adaptor. A cutout can be disposed in any suitable location of the substrate adaptor. For example, a cutout may be coaxial or non-coaxial with the planar body of the substrate adaptor. FIGS. 4A-4B illustrates exemplary cutout layouts 411 and 412 in vertical substrate adaptors 400 and 450 in accordance with embodiments of the present disclosure. FIG. 4A shows that the vertical substrate adaptor 400 has two cutouts configured to accommodate two wafers of the same dimension, e.g., 100 mm wafers. The cutouts 411 and 412 are each a minor segment of a 100 mm circle. FIG. 4B shows that the vertical substrate adaptor 450 has two cutouts configured to accommodate two wafers of different dimensions e.g., 50 mm and 100 mm wafers respectively. The cutouts 451 and 452 are each a semicircle. It will be appreciated that the substrate adaptors 400 and 450 have other features such as trenches, edge bands, flats and notches similar with those described in FIG. 3 which are not explicitly shown here. As described above, the overall weight of any of the adaptors 400 or 450 equals the weight of a 300 mm wafer minus the weight of the expected wafers placed therein t the slots, e.g., 411 and 412 or 451 and 452.

Figure 5:
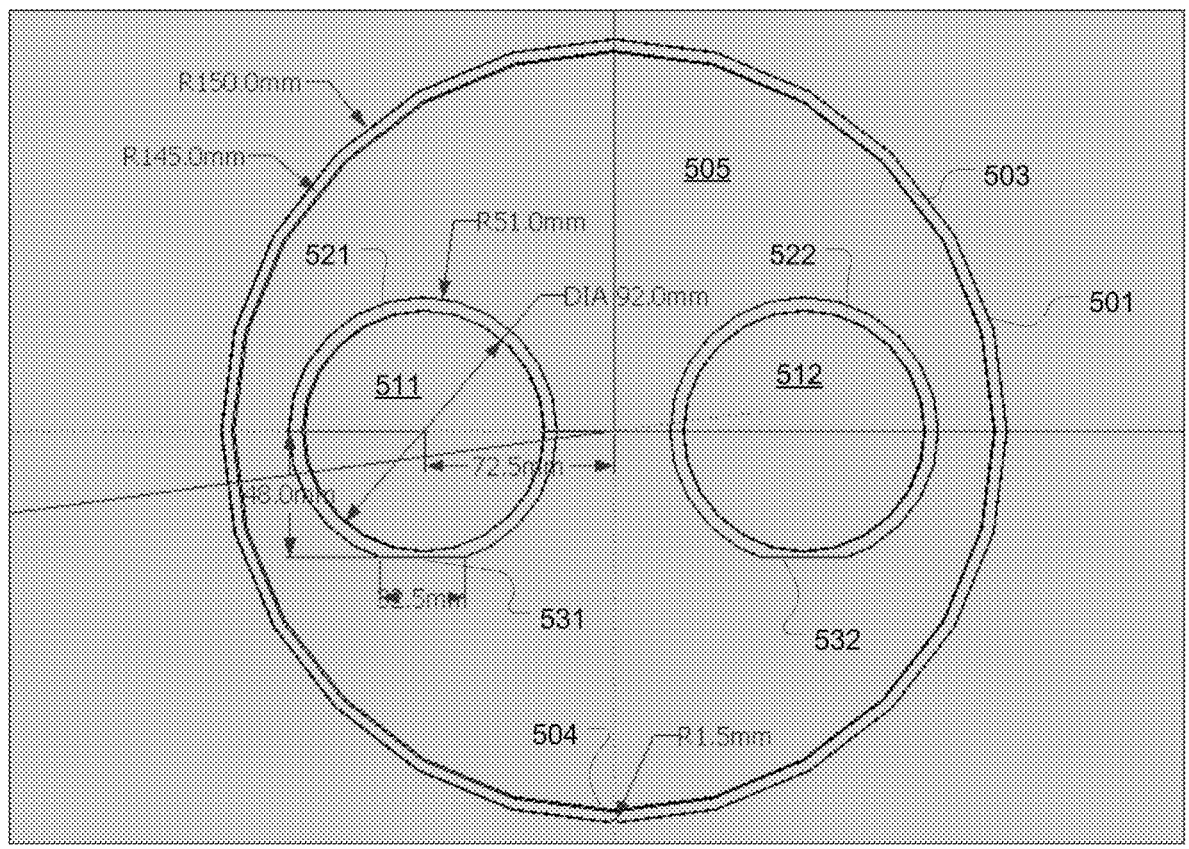
FIG. 5 illustrates the configuration of an exemplary horizontal substrate adaptor that can support two 100 mm wafers horizontally in accordance with an embodiment of the present disclosure.

FIG. 5 illustrates the configuration of an exemplary horizontal substrate adaptor 500 that can support two 100 mm wafers horizontally in accordance with an embodiment of the present disclosure. The horizontal substrate adaptor 500 is based on a 300 mm planar body 505. It is substantially circular although its circumference may have imperfect curvatures in some locations. Two 100 mm substantially circular cutouts 511 and 512 are formed symmetrically on each half of the body 505 and configured to accommodate two 100 mm wafers entirely.

A step 521 or 522 is formed around the perimeter of each cutout 511 or 512 so that a wafer can sit and be supported thereon. In this configuration, as the horizontal substrate adaptor 500 is placed horizontally (e.g., as sitting in a slot of a 300 mm wafer cassette), an entire 100 mm wafer can sits on the step and entirely fits in the cutout (e.g., see the wafers fitting in the horizontal substrate adaptors in FIG. 2). In the illustrated example, the step is about 5 mm wide. The main portion of the circular body (up to radius=145 mm) may be thicker than a 100 mm wafer. However, a 5 mm band 503 around the circle perimeter is machined to have substantially the same thickness as the edge of a 300 mm wafer such that the edge 501 can fit in a slot of a standard 300 mm wafer cassette. Further, the horizontal substrate holder 500 has an alignment notch 504 with radius of 1.5 mm, similar with a standard 300 mm wafer. By the same token, the cutouts 511-512 have alignment flats 531-532 for standard 100 mm wafers to fit in. The weight of adaptor 501 is approximately equal to the weight of a 300 mm wafer minus the weight of the wafers expected to be inserted into slots 511 and 512.

Figure 6A:
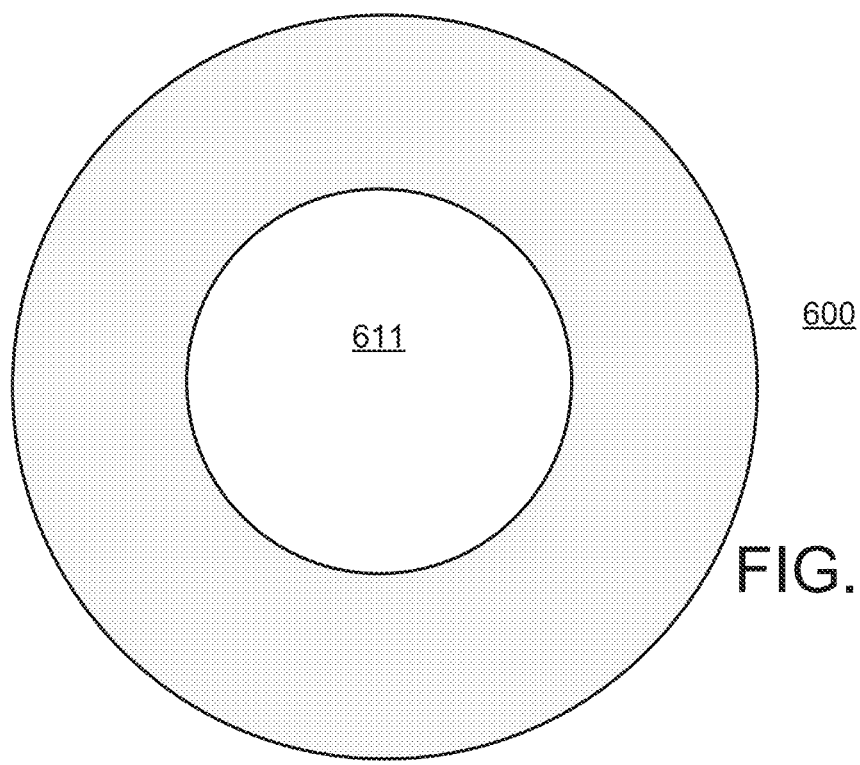
FIGS. 6A-6B illustrate exemplary cutout layouts in horizontal substrate adaptors in accordance with embodiments of the present disclosure.
Figure 6B:
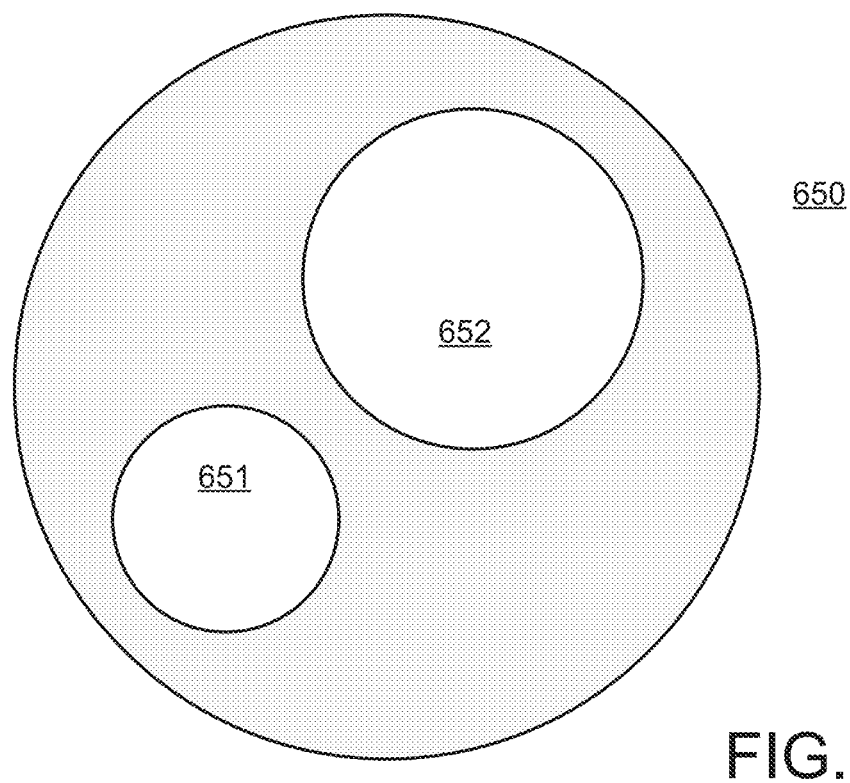

FIGS. 6A-6B illustrate exemplary cutout layouts in horizontal substrate adaptors 600 and 650 in accordance with embodiments of the present disclosure. FIG. 6A shows that the horizontal substrate adaptor 600 has a single cutout 611 configured to accommodate a 150 mm wafer. FIG. 6B shows that the horizontal substrate adaptor 650 has two cutouts 651 and 652 configured to accommodate two wafers of different dimensions e.g., 50 mm and 100 mm wafers respectively. It will be appreciated that the substrate adaptors 600 and 650 have other features such as steps, edge bands, flats and notches similar with those described in FIG. 5 which are not explicitly shown here. The weight of either 600 or 650 is equal to the weight of a 300 mm wafer minus the weight of the wafer(s) that are expected to be inserted therein.

A substrate adaptor according to an embodiment of the present disclosure can be implemented by machining a planar quartz body or any other suitable material in any manner that is well known to a person skilled in the art.

Figure 7:
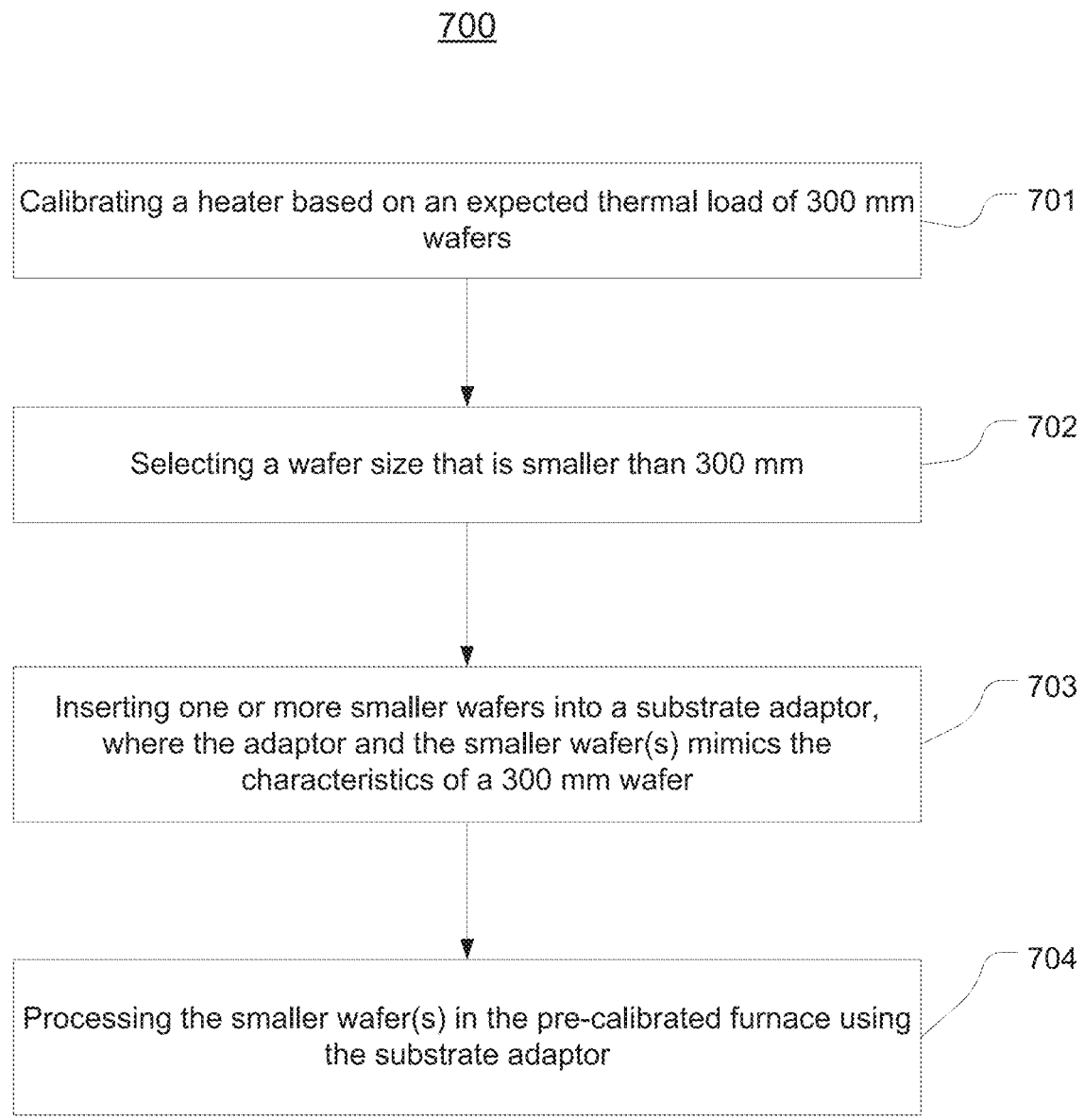
FIG. 7 is a flow chart depicting an exemplary method of processing a smaller wafer in a processing chamber that is optimized for 300 mm wafers by using a substrate adaptor in accordance with an embodiment of the present disclosure.

FIG. 7 is a flow chart depicting an exemplary method 700 of processing a smaller wafer in a processing chamber that is optimized for 300 mm wafers by using a substrate adaptor in accordance with an embodiment of the present disclosure. In this example, the wafer is loaded and processed in a magnetic annealing furnace as shown in FIGS. 1-2. At 701, the heater of the annealing furnace, and more particularly the PID controller of the heater, is calibrated based on an expected thermal load of 300 mm wafers. At 702, a smaller size of wafers is selected, e.g., 50 mm or 150 mm. At 703, one or more smaller wafers are inserted into a substrate adaptor. The adaptor and the smaller wafer(s) mimic the characteristics of the 300 mm wafer. Depending on the process, the substrate adaptor can be a vertical or a horizontal one, as described in greater detail above with reference to FIGS. 3-6B. At 704, the smaller wafer(s) coupled with the substrate adaptor is loaded into the annealing furnace and processed in the pre-calibrated furnace. The wafer(s) and substrate adaptor may be loaded into a cassette before loading into the annealing furnace.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A planar wafer adaptor comprising:
   a planar body comprising a first boundary having a perimeter contour substantially equivalent to a portion of a semiconductor wafer of a first dimension;
   one or more cutouts from the planar body; and
   a slot disposed along a boundary of each of said one or more cutouts, wherein said slot is configured to receive an edge of a semiconductor wafer of a predefined dimension and to vertically accommodate said semiconductor wafer of said predefined dimension when said planar body is vertically oriented, wherein said planar body has a thermal mass that is substantially equivalent to a thermal mass of said semiconductor wafer of said first dimension minus a sum of thermal masses of one or more semiconductor wafers operable to be accommodated in said one or more cutouts at a same time.

2. The planar wafer adaptor of claim 1, wherein said one or more cutouts comprise multiple cutouts, and wherein slots of said multiple cutouts are configured to accommodate semiconductor wafers of different predefined dimensions.

3. The planar wafer adaptor of claim 1, wherein said one or more cutouts comprise multiple cutouts, and wherein slots of said multiple cutouts are configured to accommodate semiconductor wafers of a same predefined dimension.

4. The planar wafer adaptor of claim 1, wherein a boundary of said slot has a perimeter contour substantially equivalent to a portion of said semiconductor wafer of said predefined dimension.

5. The planar wafer adaptor of claim 1, wherein said planar body comprises quartz.

6. The planar wafer adaptor of claim 4, wherein said first boundary of said planar body comprises a notch for orientation thereof.

7. The planar wafer adaptor of claim 6, wherein said first boundary of said planar body is configured to fit in a cassette configured to accommodate a plurality of semiconductor wafers of said first dimension.

8. The planar wafer adaptor of claim 1, wherein said first boundary substantially defines one of: a semicircle; and an arc less than a semicircle.

9. The planar wafer adaptor of claim 1, wherein said one or more cutouts define one or more semicircles or minor segments of one or more circles.

10. The planar wafer adaptor of claim 1, wherein said slot is 3 mm in depth.

11. A planar wafer adaptor comprising:
    a planar body comprising a first boundary having a perimeter contour substantially equivalent to a portion of a semiconductor wafer of a first dimension; and
    one or more cutouts from the planar body in a form of one or more through holes on said planar body, wherein each cutout comprises:
    a boundary having a perimeter contour substantially equivalent to a semiconductor wafer of a predefined dimension; and
    a lateral step disposed along said boundary and configured to support an edge of said semiconductor wafer of said predefined dimension and configured to align said semiconductor wafer of said predefined dimension in a horizontal orientation when said planar body is aligned horizontally,
    wherein said planar body has a thermal mass that is substantially equal to a thermal mass of a semiconductor wafer of said first dimension minus a sum of thermal masses of one or more semiconductor wafers operable to be accommodated in all of said one or more cutouts.

12. The planar wafer adaptor of claim 11, wherein said planar body comprises quartz.

13. The planar wafer adaptor of claim 11, wherein said first boundary comprises a notch for orientation thereof.

14. The planar wafer adaptor of claim 11, wherein said first boundary is configured to fit in a cassette configured to accommodate a plurality of semiconductor wafers of said first dimension.

15. The planar wafer adaptor of claim 11, wherein said first boundary substantially defines a circle.

16. The planar wafer adaptor of claim 11, wherein said one or more cutouts define substantially one or more circles.

17. The planar wafer adaptor of claim 11, wherein said boundary comprises a flat cut.

18. The planar wafer adaptor of claim 11, wherein a semiconductor wafer of said first dimension is 300 mm in diameter.

19. The planar wafer adaptor of claim 11, wherein said semiconductor wafer of said predefined dimension is one of: 50 mm; 100 mm; 150 mm; and 200 mm in diameter.

20. The planar wafer adaptor of claim 11, wherein said one or more cutouts comprise multiple cutouts, and wherein lateral steps of said multiple cutouts are configured to accommodate semiconductor wafers of different predefined dimensions or of a same predefined dimension.

* * * * *